(12) United States Patent
Yasuoka et al.

(10) Patent No.: US 7,053,416 B2
(45) Date of Patent: May 30, 2006

(54) LED DISPLAY APPARATUS

(75) Inventors: Tsuyoshi Yasuoka, Naka-gun (JP); Hirokazu Yoshida, Tokushima (JP)

(73) Assignee: Nichia Corporation, Anan (JP)

( * ) Notice: Subject to any disclaimer, the term of this patent is extended or adjusted under 35 U.S.C. 154(b) by 105 days.

(21) Appl. No.: 10/857,025

(22) Filed: Jun. 1, 2004

(65) Prior Publication Data

US 2004/0238834 A1   Dec. 2, 2004

(30) Foreign Application Priority Data

May 30, 2003   (JP)   ............................. 2003-156063

(51) Int. Cl.
*H01L 33/00* (2006.01)

(52) U.S. Cl. ..................... 257/88; 257/101; 257/99

(58) Field of Classification Search ............. 257/88–99
See application file for complete search history.

(56) References Cited

U.S. PATENT DOCUMENTS 5,523,591 A * 6/1996 Fleming et al. ............... 257/91
5,583,349 A * 12/1996 Norman et al. ............... 257/88
5,821,567 A * 10/1998 Ogihara et al. ............... 257/88
6,963,085 B1 * 11/2005 Chou ........................... 257/88

FOREIGN PATENT DOCUMENTS

JP   10-161569 A   6/1998
JP   11-265499 A   9/1999

* cited by examiner

*Primary Examiner*—Cuong Nguyen
(74) *Attorney, Agent, or Firm*—Smith Patent Office (57) ABSTRACT

A highly reliable LED display apparatus is provided in which dust and other similar particles are prevented from entering spaces formed between light-emitting diodes and openings in a mask member provided on a circuit board. The LED display apparatus has the circuit board, the light-emitting diodes provided at predetermined positions thereon, and the mask member which is disposed approximately parallel to the circuit board. The mask member has openings at positions corresponding to the light-emitting diodes which are placed inside the respective openings. In the LED display apparatus described above, the openings of the mask member have fine projections on side surfaces thereof. The fine projections can be formed on the mask member by a flock processing technique.

31 Claims, 6 Drawing Sheets

LED DISPLAY APPARATUS

BACKGROUND OF THE INVENTION

1. Field of the Invention

The present invention relates to display apparatuses such as a display having a plurality of light-emitting diodes (LEDs). More particularly, the invention relates to a high quality LED display apparatus having a relatively simple structure which provides superior image contrast properties.

2. Discussion of the Related Art

In recent years, there have been developed light-emitting diodes capable of emitting red, green, and blue colors (hereinafter referred to as "RGB" in some cases) and light-emitting diodes which are formed of light emitting elements in combination with phosphor materials so that they emit various colors, such as a white color, with a high brightness. Since a light-emitting diode (hereinafter referred to as an "LED") is a solid-state element, it has superior resistance against vibration, a low-power consumption rate, a long operating life, and superior drive properties such as a high-speed drive. Accordingly, the light-emitting diodes have been increasingly used for various applications such as light sources for signal heads and full-color LED displays.

When the LED display apparatuses described above are used, a black or frosted mask member is provided between individual light-emitting diodes arranged on an observation side of a circuit board in order to increase the contrast. The mask member described above is made of a resin material or the like. The mask member, in the form of a plate having openings provided therein, is placed on the circuit board. The openings are located at predetermined positions in the mask member so that the light-emitting diodes on the circuit board penetrate or fit through the respective openings. In addition, since the mask member is provided on the circuit board, the mask member also serves as a protective layer for protecting the conductive pattern.

The mask member described above must be formed to have a dimensional tolerance to a certain extent since the light-emitting diodes are arranged on the circuit board and should penetrate through the respective openings. The openings are each formed slightly larger than the size of the light-emitting diode to consider many features including the contrast, the thermal expansion of the light-emitting diodes during light emission, and the like.

The technique described above has been disclosed, for example, in Japanese Unexamined Patent Application Publication No. 10-161569.

However, when the mask member as described above is provided on the circuit board, dust and the like may enter spaces between the openings and the light-emitting diodes and may gradually accumulate on the circuit board. Also it becomes difficult to perform cleaning due to the presence of dust at the boundaries between the openings and the light-emitting diodes. In addition, operational malfunctions may occur in some cases. An LED display apparatus used indoors usually does not use a cover or the like on the observation side, and hence in the case described above, it becomes more difficult for the mask member to protect the circuit board from dust and the like. In addition, a degradation in the contrast ratio which is caused by dust and the like adhering to the observation-side surface of the LED display apparatus should be prevented.

SUMMARY OF THE INVENTION

According to the present invention, in an LED display apparatus having a plurality of LEDs arranged on a circuit board, a highly reliable LED display apparatus can be obtained which has superior stability by preventing dust and the like from reaching the circuit board containing the LEDS. In addition, the mask member can also be obtained which prevents reflection toward the observation side and which can suppress the degradation in image contrast caused by dust and the like which accumulates on the surface of the circuit board.

In accordance with a first aspect of the present invention, an LED display apparatus is provided comprising a circuit board, light-emitting diodes provided at predetermined positions on the circuit board, and a mask member which is disposed approximately parallel to the circuit board and which has openings at positions corresponding to the light-emitting diodes, where the light-emitting diodes are placed inside the respective openings. In the LED display apparatus described above, the mask member has fine projections on the side surfaces of the openings.

According to the structure described above, by the presence of the fine projections provided on the side surfaces of the openings of the mask member, dust and the like are prevented from entering spaces formed between the light-emitting diodes and the openings provided in the mask member. As a result of this arrangement, an LED display apparatus having a long-term stability can be realized. In addition, since dust and the like stay on the fine projections, cleaning of the surface of the display apparatus can be easily performed. Furthermore, stress generated by the thermal expansion of light-emitting diodes in light emission can be reduced. In addition, since the spaces between the openings and light-emitting portions are covered with the fine projections, the circuit board provided under the mask member becomes difficult to see, and as a result, an LED display apparatus that displays superior images can be realized.

In addition, in the LED display apparatus in accordance with a second aspect of the present invention, the fine projections described above are preferably formed on at least upper portions of the side surfaces of the openings.

According to the structure described above, dust and the like can be prevented from entering the boundaries between the openings and the light-emitting diodes.

In addition, in the LED display apparatus in accordance with a third aspect of the present invention, the fine projections are preferably formed on the entire side surfaces of the openings.

According to the structure described above, dust and the like can be more effectively prevented from entering the boundaries between the openings and the light-emitting diodes.

In addition, in accordance with a fourth aspect of the present invention, there is provided an LED display apparatus comprising a circuit board, light-emitting diodes arranged at predetermined positions on the circuit board, and a mask member which is disposed approximately parallel to the circuit board and which has openings at positions corresponding to the light-emitting diodes, in which the light-emitting diodes are placed inside the respective openings. In the LED display apparatus described above, the mask member has fine projections on the entire side surfaces of the openings, and the fine projections and the circuit board are formed with spaces therebetween.

According to the structure described above, since the fine projections formed on the side surfaces of the openings of the mask member are not in direct contact with the circuit board, a highly reliable LED display apparatus can be realized. In addition, since the fine projections may not extend to the bottom surface of the mask member, the mask member can be preferably disposed parallel to the light-emitting surfaces of the light-emitting diodes.

In addition, in accordance with a fifth aspect of the present invention, there is provided an LED display apparatus comprising a circuit board, light-emitting diodes arranged at predetermined positions on the circuit board, and a mask member which is disposed approximately parallel to the circuit board and which has openings at positions corresponding to the light-emitting diodes, in which the light-emitting diodes are placed inside the respective openings. In the LED display apparatus described above, corner portions formed on a light observation-side surface of the mask member and side surfaces of the openings thereof have inclined surfaces.

According to the structure described above, when the fine projections are formed on the mask member, even at the corner portions formed on the light observation-side surface of the mask member and the side surfaces of the openings thereof, superior adhesion can be obtained without any degradation in adhesive strength.

In addition, in the LED display apparatus in accordance with a sixth aspect of the present invention, the fine projections are preferably in contact with approximately 20% to 80% of the area of each of the side surfaces of the light-emitting diodes.

According to the structure described above, dust and the like are preferably prevented from entering the spaces described above, and while the spaces between the light-emitting diodes and the mask member are not substantially viewed, the image contrast can be maintained.

In the LED display apparatus in accordance with a seventh aspect of the present invention, the mask member may further have fine projections on the entire observation-side surface thereof.

According to the structure described above, reflection of outside light on the mask member can be efficiently suppressed. In addition, since the influence of an external force applied to the mask member can be reduced, damage is unlikely to be done to the LED display apparatus, and the handling thereof becomes easier.

In the LED display apparatus in accordance with an eighth aspect of the present invention, the fine projections are preferably formed by a fiber implantation technique.

According to the technique mentioned above, the fine projections are efficiently and relatively easily formed so that the front ends thereof are along the direction toward the observation side.

In the LED display apparatus in accordance with a ninth aspect of the present invention, the mask member is preferably disposed so that the observation-side surface thereof is located at a position equivalent to or higher than a light-emitting surface of each of the light-emitting diodes.

According to the structure described above, for example, in mounting the LED display apparatus, the surface of the mask member can prevent the light-emitting surfaces (surfaces of mold members) of the light-emitting diodes from being brought into contact with other constituent elements or the like. As a result, the handling of the LED display apparatus becomes easier. Furthermore, since the light-emitting diodes are not protruding from the surface of the mask member, even when adhering onto the surface of the display apparatus, dust and the like can be easily removed by a roller provided with an adhesive tape or the like. This arrangement allows cleaning to be easily performed.

In the LED display apparatus in accordance with a tenth aspect of the present invention, the openings of the mask member each preferably have an inclined side surface.

According to the structure described above, the fine projections are easily formed on the side surfaces by fiber implantation, and as a result, the mask member may not interfere with light emitted from the light-emitting diodes.

In addition, in the LED display apparatus in accordance with an eleventh aspect of the present invention, at least some of the fine projections on the side surface of each opening preferably project in the direction perpendicular to the side surface.

According to the structure described above, when the light-emitting diode is thermally expanded, stress generated due to the contact with the side surface of the opening can be efficiently reduced. As a result, the reliability of the light-emitting diode can be improved. In addition, since grooves formed between LED units can be more efficiently covered, a superior image can be displayed.

In the LED display apparatus in accordance with a twelfth aspect of the present invention, the fine projections each preferably have a length of 0.3 to 1 mm.

According to the structure described above, adhesion of dust and the like on the surface of the display apparatus can be prevented.

In the LED display apparatus in accordance with a thirteenth aspect of the present invention, the fine projections each preferably have a length of less than 0.3 mm.

According to the structure described above, adhesion of dust and the like on the surface of the display apparatus can be effectively prevented.

In the LED display apparatus in accordance with a fourteenth aspect of the present invention, the fine projections each preferably comprise 3 decitex or less of fiber material.

According to the structure described above, since fine projections having good flexibility can be formed, stress caused by the thermal expansion of the light-emitting diode preferably can be reduced. In addition, since fibers bent by an external force are likely to stand up along the direction toward the observation side, the handling of the LED display apparatus becomes easier.

In addition, in the LED display apparatus in accordance with a fifteenth aspect of the present invention, the fine projections preferably comprise a polyester material.

According to the structure described above, since polyester material has good light resistance, the fine projections can be used for a relatively long period of time without discoloration. In addition, since polyester material has a superior elastic recovery, an increase in brightness which unevenly occurs at parts of the display apparatus can be prevented. The uneven increase is caused by compressing the polyester material during mounting.

In addition, in the LED display apparatus in accordance with a sixteenth aspect of the present invention, the fine projections preferably comprise a nylon material.

When the structure described above is combined with the structure in which the corner portions formed of the light observation-side surface of the mask member and the side surfaces of the openings thereof have inclined surfaces, the fine projections can be preferably formed.

In the LED display apparatus in accordance with a seventeenth aspect of the present invention, the fine projections preferably have a dark color.

According to the structure described above, an LED display apparatus having superior image contrast can be realized.

In the LED display apparatus in accordance with an eighteenth aspect of the present invention, the fine projections preferably comprise a fiber material containing a coloring agent.

The structure described above enables the fine projections to have superior light resistance.

In the LED display apparatus in accordance with a nineteenth aspect of the present invention, the mask member preferably comprises at least one louver.

According to the structure described above, sunlight and artificial light can be efficiently shaded, and this further improves the contrast.

In the LED display apparatus in accordance with a twentieth aspect of the present invention, the louver preferably has fine projections thereon.

According to the structure described above, reflection of light emitted from the light-emitting diode can be suppressed by the louver.

In the LED display apparatus in accordance with a twenty-first aspect of the present invention, the mask member preferably has a lattice-shaped groove portion between the openings.

When a plurality of LED units are integrated together to form an LED display apparatus, it may occur that the grooves and/or spaces formed between the above units become visible and can be viewed along the boundary lines therebetween. However, according to the structure described above, viewing the grooves and/or spaces can be suppressed by uniformly forming the lattice-shaped groove portion between the light-emitting diodes.

In the LED display apparatus in accordance with a twenty-second aspect of the present invention, the light-emitting diodes are preferably SMD type light-emitting diodes.

According to the structure described above, an LED display apparatus having superior color mixing characteristics can be realized. In addition, when compared to lamp type devices, the applications can be expanded due to various advantages, such as a large viewing angle and narrow pitches between the light-emitting diodes.

BRIEF DESCRIPTION OF THE DRAWINGS

The above and other objects and features of the present invention will be clearly understood from the following description with respect to the preferred embodiment thereof when considered in conjunction with the accompanying drawings and diagrams, in which.

DETAILED DESCRIPTION OF THE PREFERRED EMBODIMENTS

Figure 1:
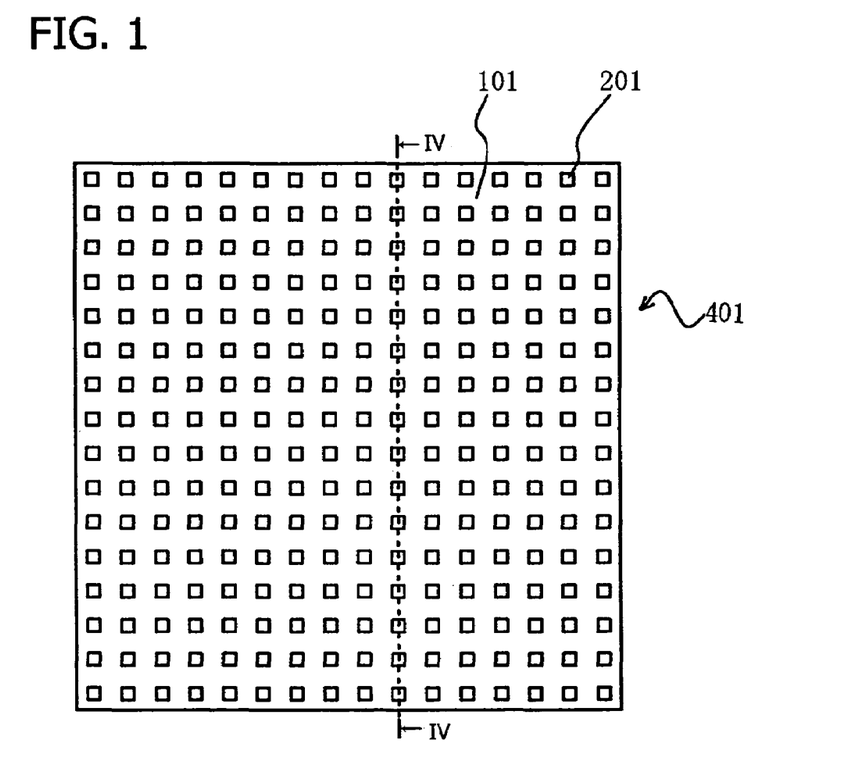
FIG. 1 is a schematic front view showing an LED display apparatus of a first embodiment according to the present invention.
Figure 4:
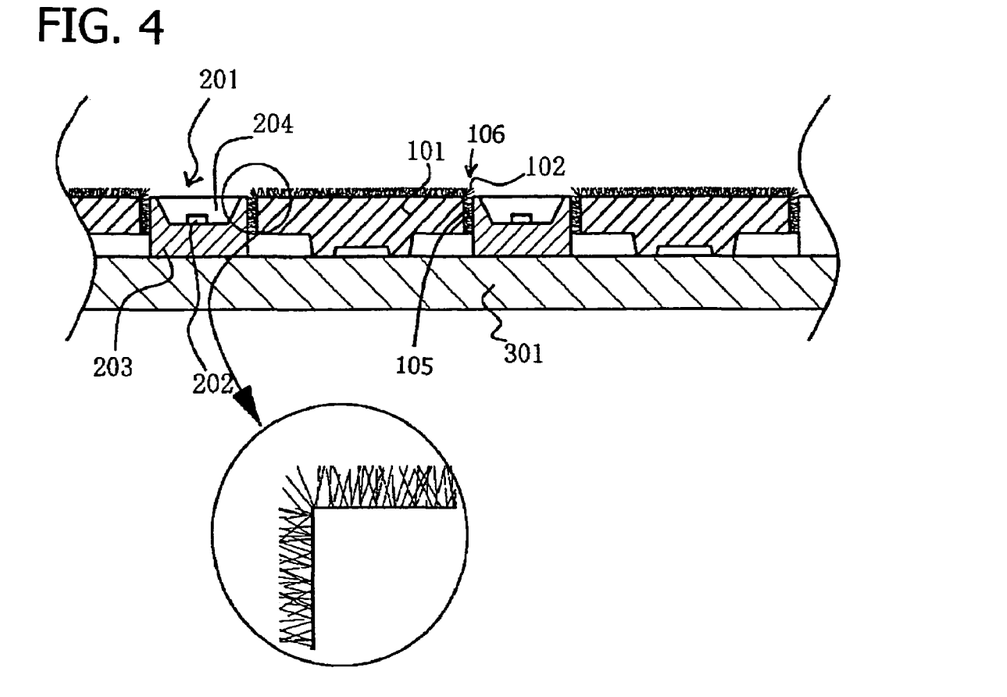
FIG. 4 is a schematic, enlarged, cross-sectional view taken along line IV—IV in FIG. 1 showing a fiber implanted portion of the first embodiment according to the present invention.

FIG. 4 includes a schematic, enlarged, cross-sectional view of an LED unit of an LED display apparatus taken along a line IV—IV in FIG. 1 according to the present invention. FIG. 4 also includes an enlarged view of the fine projections. In addition, FIG. 1 shows an LED unit 401 formed of light-emitting diodes 201 on an emission light observation-side surface of a circuit board 301 with predetermined intervals provided therebetween. The predetermined intervals between the light-emitting diodes 201 provided on the circuit board 301 are optionally determined by considering the areas of the LED unit 401 and the LED display apparatus, the size of the light-emitting diodes 201, and the like. In addition, on the rear side of the circuit board 301 of the LED unit 401, a drive circuit (not shown in the figures) is provided for driving the light-emitting diodes 201 provided on the circuit board 301.

In order to improve the visibility of light emitted from the light-emitting diodes 201, a dark-colored mask member 101 is provided between the light-emitting diodes 201 on the circuit board 301 so as to be approximately parallel thereto. The mask member 101 has a plate shape and has a plurality of openings 106 each formed of one or more side surfaces 105 at positions at which the light-emitting diodes 201 are to be disposed. The opening 106 is formed slightly larger than the light-emitting diode 201 so that the diode 201 easily penetrates or extends into the corresponding opening 106. In addition, with the structure as described above, thermal expansion of the light-emitting diode 201 during light emission occurs, however the stress that is generated by the contact between the side surfaces 105 of the opening 106 of the mask member 101 and the light-emitting diode 201 may not do any damage to the light-emitting diode 201. Furthermore, removing and replacing of the mask member 101 can be easily performed. On the side surfaces 105 of the openings of the mask member 101, fine projections 102 made of fine fibrous flocks are formed by a fiber implantation technique. In addition, on the observation-side surface of the mask member 101, the fine projections 102 made of flocks are also formed.

Since the fine projections 102 are provided on the side surfaces 105 of the openings of the mask member 101, dust and the like are prevented from entering the boundary portions between the light-emitting diodes 201 and the side surfaces 105 of the openings. In addition, since dust and the like accumulates on the fine projections 102, they can be simultaneously removed when cleaning the surface of the mask member 101 is performed. Therefore, easy cleaning can be obtained with this structure. Furthermore, it is possible to suppress the view of the boundary portions between the side surfaces 105 of the openings of the mask member 101 and the light-emitting diodes 201.

In particular, when an LED display apparatus is used indoors, the color of the surface of the mask member 101 may be viewed as pale in some cases when compared to the real color thereof due to the influence of light from an interior lamp or the like. However, when the fine projections 102 formed by the flock processing described above are provided between the light-emitting diodes 201, reflection of outside light on the observation-side surface is suppressed and the image contrast can be improved. Therefore sharper images can be displayed with this arrangement. Hereinafter, with reference to drawings, the individual constituent elements will be described in detail.

Circuit Board 301

A glass-epoxy resin having a predetermined pattern made of copper foil is preferably used for the circuit board of the embodiments according to the present invention. The light-emitting diodes 201 are disposed on a conductive pattern of the circuit board at regular intervals in the lateral and vertical directions. For mounting the light-emitting diodes 201 on the circuit board, the circuit board 301 provided with the light-emitting diodes 201 is allowed to pass through a flow soldering apparatus. By this step, the light-emitting diodes 201 are electrically connected to the conductive pattern on the circuit board 301 and can also be relatively easily fixed thereon.

Light-Emitting Diode 201

For the light-emitting diodes 201 disposed on the circuit board 301, various emitting colors may be selected in accordance with the selected application. In a display application, when light-emitting diodes are used which are composed of light-emitting elements 202 capable of emitting red, blue, and green colors disposed in package members 203 which are equivalent to each other, various emitted light colors, such as white light, can be obtained.

The package member 203 used in this embodiment of the present invention is made of a resin or a ceramic. The resin can include polyphthalamide (PPA), polycarbonate, polyphenylene sulfide (PPS), liquid crystal polymer (LCP), ABS, epoxy, phenolic, acrylic, PBT resins, or the like. The material mentioned above is injected in a molten state into a mold from a gate thereof located at a position at which the bottom surface of the package member 203 is to be formed. This step is followed by curing. Prior to the mold being closed, a plurality of positive and negative lead frames are placed therein so as to be inserted into the package member described above. In addition, various dyes and pigments may be preferably used as a coloring agent for coloring the package member a dark color. As particular materials, for example, $Cr_2O_3$, $MnO_2$, $Fe_2O_3$, and carbon black may be used. In order to efficiently obtain light from the inside of the package, calcium carbonate, aluminum oxide, and/or titanium oxide are preferably and optionally added to the various resins mentioned above as a light diffusing agent. By the addition of the material mentioned above, a white package member having a high reflectance can be formed. As described above, a light-emitting diode having a superior contrast ratio can be realized when the surface of the package member 203 at the light observation side is colored a dark color.

The light-emitting element 202 used in the embodiments of the present invention is formed of a nitride semiconductor, such as InN, AlN, GaN, InGaN, AlGaN, or InGaAlN, as a light-emitting layer on a substrate by a MOCVD method or the like. The nitride semiconductor is formed, for example, of an n-type contact layer of an n-type GaN, an n-type cladding layer of an n-type AlGaN, and a p-type contact layer of a p-type GaN deposited in that order on a sapphire substrate. As the semiconductor structure, for example, a homo structure, a hetero structure, or a double hetero structure provided with an MIS junction, a PIN junction, or a PN junction may be used. Various wavelengths of emitted light may be selected by changing materials for forming the semiconductor and the mixed crystal ratio thereof. In addition, a mono- or a multi-quantum well structure may also be formed in which the semiconductor active layer is formed thin so that the quantum effect can be obtained. Furthermore, the active layer may be doped with a donor impurity, such as Si or Ge, or an acceptor impurity such as Zn or Mg. The wavelength of the light-emitting element may be widely changed from the ultraviolet region to the red region by changing the indium (In) content of InGaN in the active layer or the type of impurity to be doped into the active layer.

For making the electrical connections, the light-emitting elements 202 are placed on lead frames (not shown) provided inside the package members 203 with a conductive adhesive provided therebetween or they are connected to lead frames with conductive wires. As a adhesive agent, for example, an epoxy or a silicone resin may be used when the light-emitting element is made of a nitride semiconductor grown on a sapphire substrate and it emits blue or green light. In addition, when considering the degradation caused by light or heat emitted from the light-emitting element, a solder such as an Au—Sn eutectic crystal or a brazing material such as a low melting point metal may be used instead of the resins. In addition, as for a light-emitting element which is made of GaAs or the like and emits a red color, since electrodes may be formed on two sides thereof, die bonding can be performed on the lead frames using, for example, a conductive paste containing silver, gold, palladium, or the like.

As for the light-emitting element 202 used as the light-emitting diode of the embodiments, the materials and manufacturing methods thereof are not particularly limited to the examples described above. In addition, monochromatic light emitted from one type of light-emitting element, mixed light formed by using two types of light-emitting elements, mixed light formed of light from a light-emitting element and excited light from a phosphor material, or the like may be optionally selected in accordance with the particular application of the LED display apparatus.

Mask Member 101

The size of the mask member 101 provided on the circuit board 301 is optionally determined in accordance with the external form of the LED unit 401. The base body of the mask member 101 having a plurality of openings 106 therein is formed. The openings 106 in the mask member are through-holes formed in accordance with the shape of the light-emitting diode 201 and are each slightly larger than the size of the LED. The openings are formed at predetermined intervals at positions corresponding to those at which the light-emitting diodes 201 are disposed on the circuit board

301. When the light-emitting diodes 201 are placed inside the respective openings 106, only the light-emitting surfaces of the light-emitting diodes 201 are exposed. Thus, the entire surface of the circuit board 301 other than the light-emitting surfaces can be covered.

Figure 5:
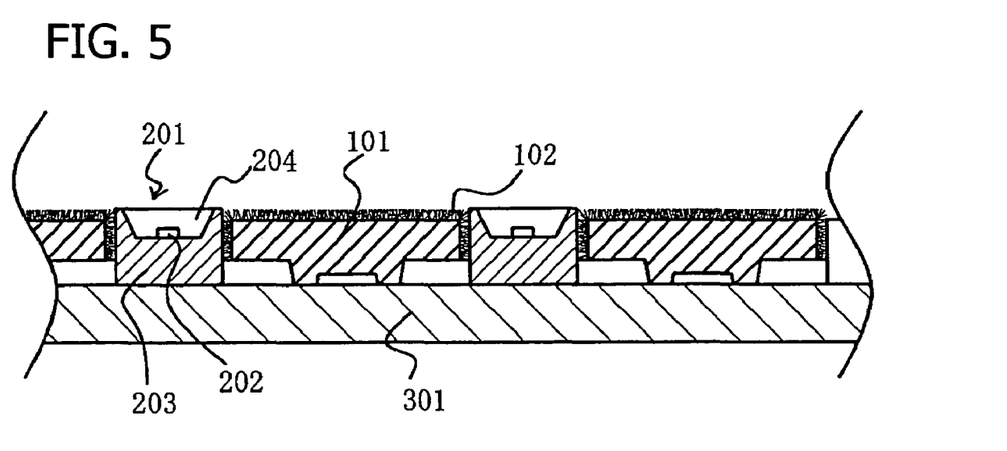
FIG. 5 is a schematic, enlarged, cross-sectional view showing a fiber implanted portion of fourth embodiment according to the present invention.
Figure 6:
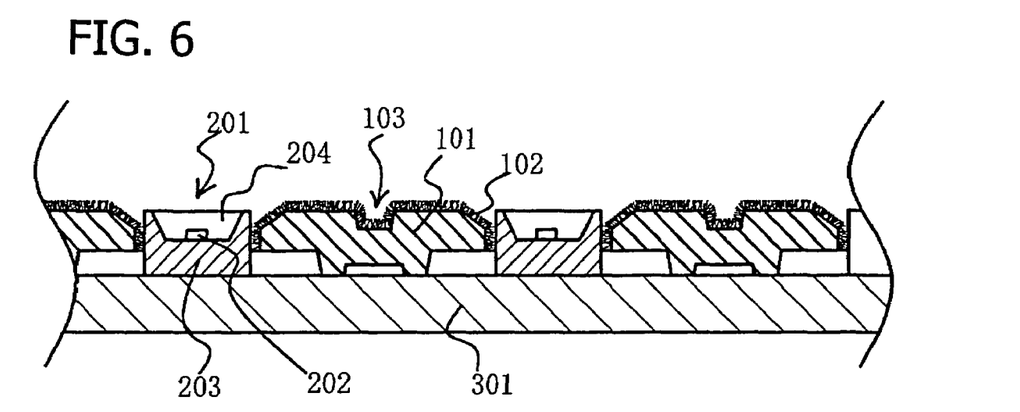
FIG. 6 is a schematic, enlarged, cross-sectional view taken along line VI—VI in FIG. 2 showing a fiber implanted portion of the second embodiment according to the present invention.
Figure 9:
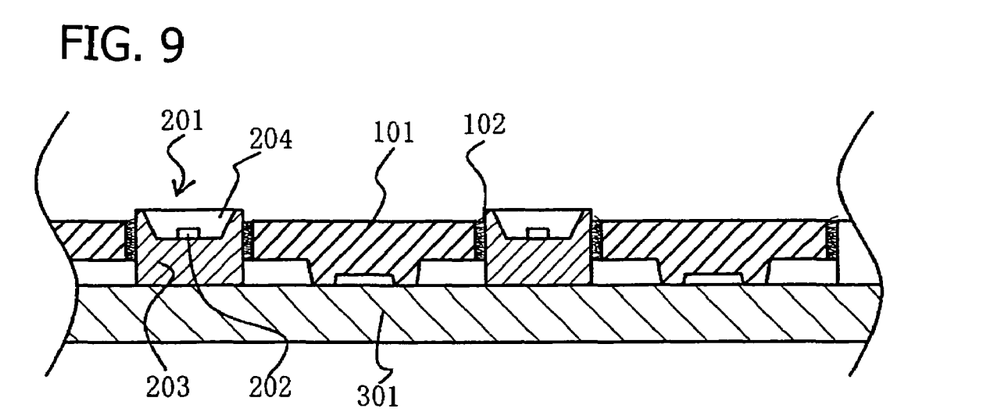
FIG. 9 is a schematic, enlarged, cross-sectional view showing a fiber implanted portion of a seventh embodiment according to the present invention.

As shown in FIG. 5, the mask member 101 is disposed between the light-emitting diodes 201. The surface of the mask member 101 (including the ends of the fine projections 102) is disposed equal to or below the light-emitting surface of the light emitting diodes 201. It is preferable that the position of the surface of the mask member 101 (including the ends of the fine projections 102) be equal to or higher than that of the light-emitting surface of the light-emitting diode 201 as shown in FIG. 4. The reason for this is that, even when the LED display apparatus is brought into contact with some other constituent elements or the like during mounting or other procedures, damage done to the light-emitting diodes can be suppressed. In addition, as shown in FIG. 9, the surface of the mask member 101 (without any fine projections 102 on the upper surface) may be located at a position lower than that of the light-emitting surface of the light-emitting diode 201. In this case, the viewing angle of light emitted from the light-emitting diode 201 can be maximized. In addition, as shown in FIG. 6, in the case in which the surface of the mask member 101 is disposed at a position higher than that of the light-emitting surface of the light-emitting diode 201, by forming the opening so that the side surfaces 105 thereof include or are next to inclined surfaces, light emitted from the light-emitting diode 201 can be prevented from being interfered with. As defined herein, an inclined surface can include a planar surface and/or a curved surface.

For forming the base body of the mask member 101, for example, resins, such as polycarbonate, acrylic, and ABS resins, with good weatherability, metals such as aluminum, and alloys such as stainless steel may be preferably used.

In the case in which the fine projections are formed on the entire surface of the mask member at the emission light observation side, the terms such as the surface of the mask member and the surface of the mask member on the observation side indicate the front end portions of the fine projections. Therefore the height of the mask member means the height of the entire mask member including the base body and the fine projections.

Fine Projections 102

Figure 10:
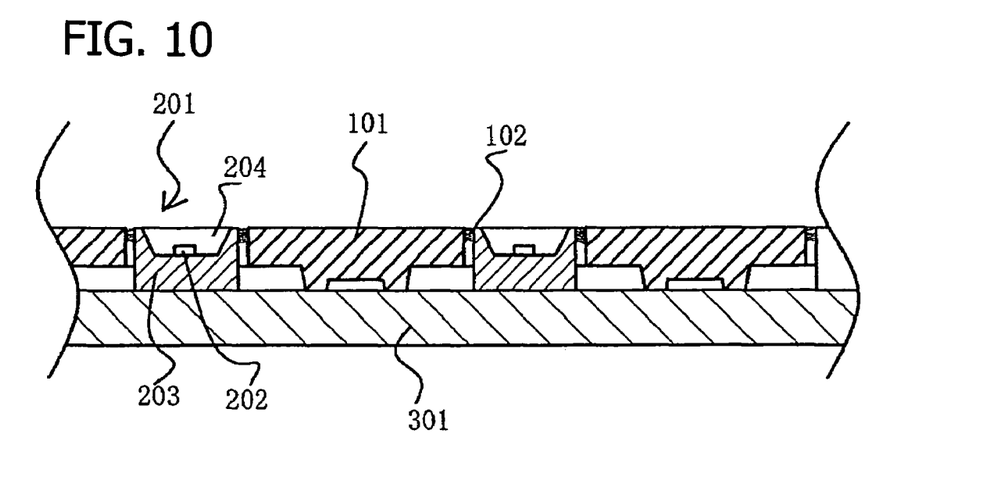
FIG. 10 is a schematic, enlarged, cross-sectional view showing a fiber implanted portion of an eighth embodiment according to the present invention.

Fine projections are formed by a fiber implantation technique on the side surfaces of the openings 106 of the mask member made using the material described above. The fiber implantation technique mentioned above can be easily performed by the steps of applying an adhesive made of a resin or the like onto the side surfaces 105 of the openings of the mask member, and subsequently implanting flocks made of a synthetic resin or the like on the side surfaces mentioned above using electrostatic attraction by applying a high DC voltage. Since the fine projections 102 are formed on the side surfaces 105 of the openings of the mask member 101 by this flock processing, dust and the like are prevented from entering spaces formed between the openings 106 of the mask member 101 and the light-emitting diodes 201. As a result, the circuit board 301 can be more reliably protected, and hence the control can be more stably performed for a long period of time. A plurality of fine projections 102 formed by the flock processing as described above may not be provided over the entire side surfaces 105 of the openings of the mask member 101. As shown in FIG. 10, when the fine projections are provided on at least the upper portions (on the observation surface side) of the side surfaces 105 of the openings, the fine projections 102 can prevent dust and the like from entering the spaces described above.

In addition, as is the case described above, when the fine projections 102 formed by this flock processing are also provided over the entire surface of the mask member 101 at the emission light observation side, an LED display apparatus having a high contrast can be realized. As described above, when fiber implantation is performed on the surface of the mask member 101 at the emission light observation side using electrostatic attraction by applying a high DC voltage, each flock can be adhered and fixed to the above surface so as to be perpendicular thereto. Accordingly, the image contrast can be further improved since the front ends of the individual flocks can be easily arranged in the direction toward the light observation side compared to the case where irregularities are formed by simply roughing the surface of a shading portion (mask member).

As the adhesive used for fiber implantation, for example, an acrylic resin, such as a styrene-acrylic resin or an acrylic-modified polyolefin, an epoxy resin, and a melamine resin may be preferably used. In addition, various types of flocks may be used in combination. As a fiber material for forming flocks, it is preferable to use a material which has good properties for absorbing reflected and scattered light and which is relatively easily processed.

As a particular fiber material, nylon, polyester, rayon, and cotton may be mentioned by way of example. In addition, for coloration of a dark color, such as black or blue, having good light absorption properties, a coloring agent may be contained in the fibers, or coloration may be performed for surfaces of fibers. When the flocks described above are colored a dark color and preferably a black color, the image contrast can be improved. In addition, the base body of the mask member 101 is also preferably colored with a color selected from those mentioned above.

When nylon or polyester is used as the material for the flocks, their elastic recovery is superior. The flocks fiber implanted using these materials do not lay down on the surface even when a compressive force is applied to the flocks during assembly. Accordingly, the problem of contrast irregularities may not occur. Contrast irregularities are caused by high and low contrast areas generated on the mask member 101. Thus with these materials, the handling can be easily performed. In addition, when the material described above is used, stress can be reduced by the fine projections 102 formed on the side surfaces 105 of the openings. The stress is generated by contact between the side surfaces 105 of the openings and the light-emitting diodes 201 caused by the thermal expansion when light is emitted. With this structure, damage done to the light-emitting diodes 201 caused by the stress as described above can be prevented and this allows the LED device to continuously serve to emit light.

In addition, when the flock has a length of 0.3 to 1 mm (and preferably 0.3 mm or less), dust and the like are not likely to adhere thereto, and hence an LED display apparatus having superior long-lasting image contrast can be provided. Since the projections formed by the flock processing are fine, dust and the like are likely to adhere thereto when brought into contact with the surface of a display apparatus. Since dust and the like are liable to adhere to the surface unless being removed with an adhesive tape or the like, outside light is reflected, resulting in degradation in image contrast. Accordingly, the flocks having the lengths described above are preferably used.

Furthermore, when a large area display apparatus is formed using a plurality of the LED units 401, the boundaries between the LED units 401 may have a different appearance from the other parts of the display apparatus. As a result, grooves may be viewed along the boundaries in some cases. However, according to the present invention, since being filled with the fine projections 102 provided by the flock processing, the grooves are prevented from being viewed. The lengths of the flocks may be changed in accordance with places to be fiber implanted or may be equivalent to each other regardless of the place. For example, when fine projections having a relatively large length are provided on the side surfaces 105 of the openings of the mask member, and when fine projections having a relatively small length are provided on the observation-side surface of the mask member, an LED display apparatus can be obtained in which dust and the like are unlikely to adhere onto the LED display apparatus, the grooves become less distinct, and the contrast ratio is superior.

In addition, straight flocks and bent flocks which are deformed can be used as the form of the flocks. In accordance with the use conditions of the flocks, the types of flocks may be optionally selected. For example, straight flocks may be used when the contrast viewed from the front side is important, and bent flocks may be used when the display is to be viewed from every angle.

Figure 7:
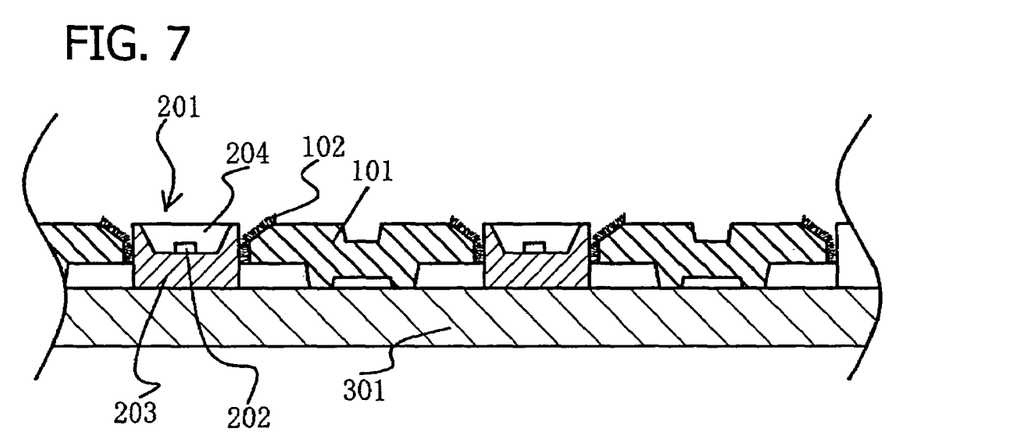
FIG. 7 is a schematic, enlarged, cross-sectional view showing a fiber implanted portion of a fifth embodiment according to the present invention.
Figure 8:
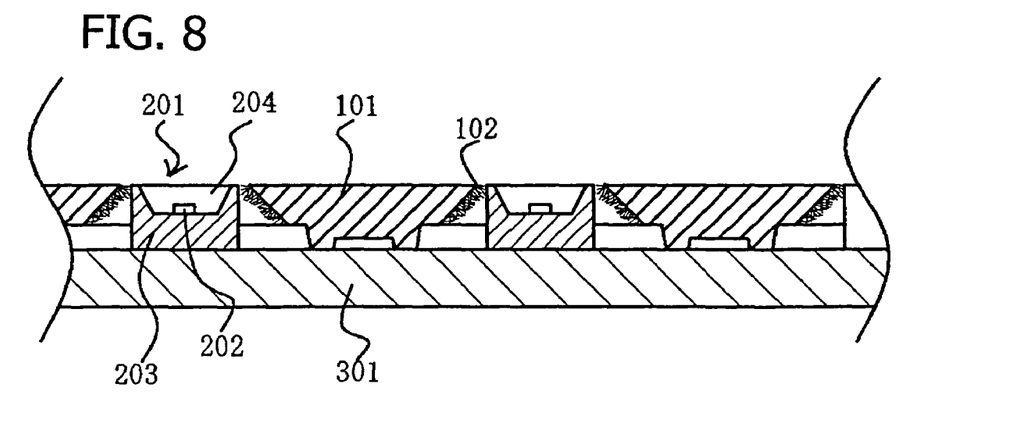
FIG. 8 is a schematic, enlarged, cross-sectional view showing a fiber implanted portion of a sixth embodiment according to the present invention.

In addition, as shown in FIG. 7, when the openings 106 of the mask member have inclined side surfaces (side surfaces are inclined to face the observation side), fiber implantation can be easily performed on the side surfaces 105 of the openings. Furthermore, when an SMD type light-emitting diode, which emits light in a relatively large area, is used as a light source, the opening having inclined side surfaces is preferably used since the light emitted from the light-emitting diode is not interfered with. In addition, as shown in FIG. 8, dust can be prevented from entering the opening 106 even when the openings 106 of the mask member have inversely inclined side surfaces (side surfaces are inclined to face the side opposite to the observation side).

In addition, flocks used for an LED display apparatus can be made of nylon or polyester having a decitex of preferably 1 to 3. When a greater number of finer flocks are provided on the surface of the mask member 101, the image contrast can be improved.

Any process may be used as a process for forming the fine projections 102 on the side surfaces 105 of the openings of the mask member 101, in addition to the flock processing described above, as long as fine projections can be formed from a synthetic resin.

EXAMPLE 1

First, on a circuit board 301 having a size of 160 mm by 160 mm and made of a glass fiber reinforced epoxy resin provided with a conductive pattern, 256 pieces of the light-emitting diodes 201 were arranged in a matrix at regular intervals of 10 mm. The light-emitting diodes 201 were placed on the conductive pattern of the circuit board 301 with solder provided therebetween and were then allowed to pass through a flow soldering apparatus. As a result, the conductive pattern and the light-emitting diodes 201 were fixed and electrically connected to each other.

As the light-emitting diodes 201 arranged on the circuit board, SMD type light-emitting diodes having a size of 3 mm by 3 mm were used which were formed by the steps of placing light-emitting elements 202 capable of emitting red, green, and blue colors in respective package members 203 made of a polyphthalamide resin, and filling the packages with mold members 204 made of an epoxy resin.

Next, on the circuit board 301 provided with the light-emitting diodes 201 thereon, the mask member 101 was formed having the fine projections 102 disposed thereon by fiber implantation. The mask member 101 had openings 106 having a size of 3.6 mm by 3.6 mm so that the light-emitting diodes 201 were to be placed therein. The mask member 101 having the openings 106 as described above had a plate shape colored with a dark pigment and was formed by injection molding using a material primarily composed of a polycarbonate resin. Next, an adhesive made of a melamine resin was applied to the side surfaces 105 of the openings and the entire observation-side surface of the mask member 101.

Next, fibrous flocks having 3 decitex and a length of approximately 0.3 mm were placed in a high-voltage electrostatic field and were perpendicularly fiber implanted onto the mask member 101 using electrostatic attraction. Subsequently, the adhesive was dried, thereby fixing the flocks on the mask member 101. For the flocks, a polyester material was used containing a coloring agent beforehand which was made of a black pigment. The flocks thus formed were fiber implanted perpendicularly onto the observation-side surface of the mask member 101, so that the front ends of the flocks were along the direction toward the observation side. In addition, on the side surfaces 105 of the openings of the mask member 101, the flocks were formed so as to fill the spaces between the openings and the light-emitting diodes 201.

According to experiments carried out on the present invention, even after a weathering test for 500 and 1,000 hours was performed for the flocks which were made of a polyester material containing a coloring agent and which were processed by fiber implantation, the original properties of the flocks were maintained.

However, the fine projections 102 formed using flocks made by coloring fibers were discolored within 500 hours by the same weathering test as mentioned above. From the results described above, it was understood that fine projections formed of flocks using synthetic fibers containing a coloring agent beforehand are superior. Since the surfaces of LED display apparatuses are irradiated with sunlight and light from interior lamps, the degree of degradation in visibility becomes significantly different between the two types of fine projections described above.

By the fiber implantation process described above, the mask member 101 could be formed which had the fine projections 102 made of a plurality of flocks on the observation-side surface and the side surfaces 105 of the openings. The thickness of the mask member 101 including the fine projections 102 was approximately 1.8 mm. The mask member 101 thus formed was disposed on the circuit board 301 at the side on which the light-emitting diodes 201 were provided so that the light-emitting diodes 201 were placed inside the respective openings 106. Also catches provided on the rear side of the mask member 101 were inserted into holes formed in the circuit board 301 and fixed, thereby forming the LED unit 401 shown in FIG. 1. Next, 16 pieces of the LED units 401 thus formed were assembled together, thereby forming an LED display apparatus.

In the schematic, enlarged, cross-sectional view shown in FIG. 5, the mask member 101 is disposed at a position approximately equivalent to that of the surface of a mold member which is the light-emitting surface of the light-emitting diode. In addition, spaces between the light-emitting diodes 201 and the side surfaces 105 of the openings of the mask member 101 are filled with the flocks formed approximately perpendicular to the side surfaces 105 of the openings. As a result, dust and the like are prevented from entering the spaces described above and from accumulating on the circuit board 301. Furthermore, since the flocks are made of a flexible polyester material, stress caused by the thermal expansion of the light-emitting diode 201 is reduced and good heat dissipation can be obtained by the close contact between the side surfaces of the light-emitting diode 201 and the flocks. Hence, a significantly highly reliable LED display apparatus can be realized. In addition, since the front ends of some of the flocks on the side surfaces 105 of the openings face the observation side, the dark brightness can be further reduced. As a result, a light observation-side surface having a high contrast ratio can be realized.

EXAMPLE 2

Figure 2:
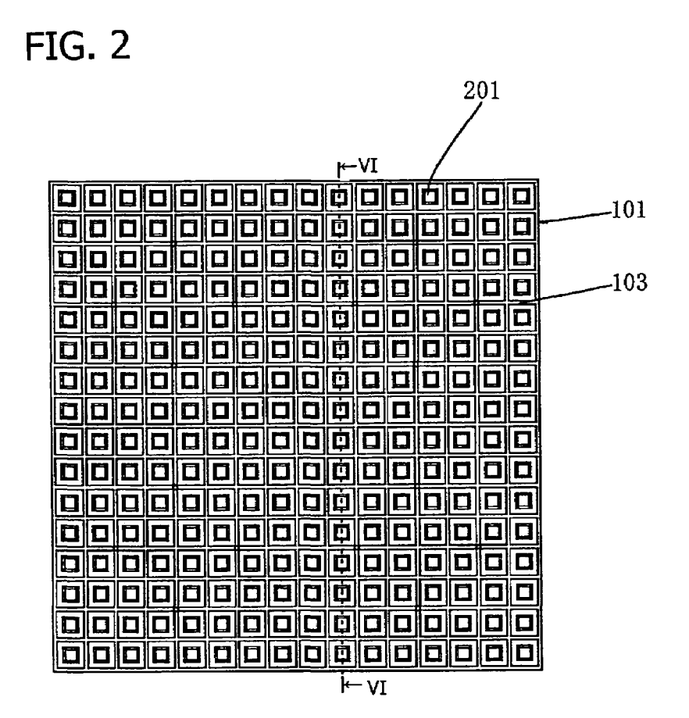
FIG. 2 is a schematic front view showing an LED display apparatus of a second embodiment according to the present invention.

An LED display apparatus according to Example 2 was obtained by disposing 16 pieces of the LED units 401 shown in FIG. 2 which were formed in the same manner as that described in Example 1. The mask member 101 having a thickness of approximately 1.8 mm was formed in accordance with the circuit board 301 having a size of approximately 160 mm by 160 mm, and the fine projections 102 formed on the mask member 101 had a length of 0.3 mm. In addition, the light-emitting diodes 201 placed on the circuit board 301 each had a size of 3 mm by 3 mm.

As shown in a schematic, enlarged, cross-sectional view in FIG. 6, the side surfaces 105 of the openings formed in the mask member 101 were inclined side surfaces facing the observation side. The fine projections 102 were formed of flocks of a black polyester material and were provided on the inclined side surfaces 105 of the openings approximately perpendicular thereto. In addition, at the lower portion (circuit board side) of the inclined surface, the fine projections 102 were in contact with the light-emitting diode 201. Hence dust and the like were prevented from entering spaces between the diodes and the openings. In addition, on the observation-side surface of the mask member 101, the fine projections 102 were also provided with the same material as that provided on the side surfaces. The mask member 101 was provided so that the surface thereof including the fine projections 102 was located at a position higher than that of the surface of the mold member 204 of the light-emitting diode 201. However, since the side surfaces 105 of the opening were inclined, light emitted from the light-emitting diode 201 was not interfered with, and as a result, an LED display apparatus having a relatively large viewing angle could be realized. In addition, since the surface of the mask member 101 was located at a position higher than that of the surface of the mold member 204 of the light-emitting diode 201, the mold member 204 could be protected. In addition, cleaning could be advantageously and easily performed. Dust which adhered onto the surface could be easily removed using a roller provided on an adhesive tape.

Between the light-emitting diodes 201, at least one groove portion 103 was formed so as to have a depth of 0.5 mm. As described above, over the entire surface, since the groove portion 103 was provided over the entire surface between the light-emitting diodes 201, the boundaries between the LED units 401 could be less distinct. In addition, since the fine projections 102 formed by flock processing covered the groove portion 103, the groove portion 103 itself was prevented from being viewed, and an LED display apparatus having a uniform contrast ratio as a whole could be realized.

EXAMPLE 3

Figure 3:
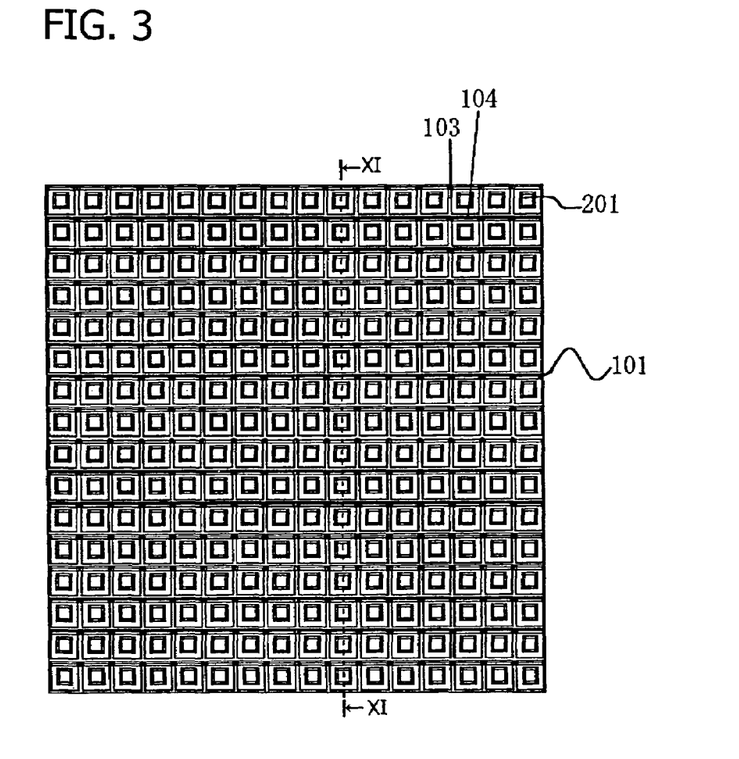
FIG. 3 is a schematic front view showing an LED display apparatus of a third embodiment according to the present invention.

The LED display unit 401 shown in FIG. 3 was obtained in the same manner as that described in Examples 1 and 2. The mask member 101 having a thickness of approximately 1.8 mm was formed in accordance with the circuit board 301 having a size of approximately 160 mm by 160 mm, and the fine projections 102 formed on the mask member 101 had a length of 0.3 mm. In addition, the light-emitting diode 201 placed on the circuit board 301 had a size of 3 mm by 3 mm.

Figure 11:
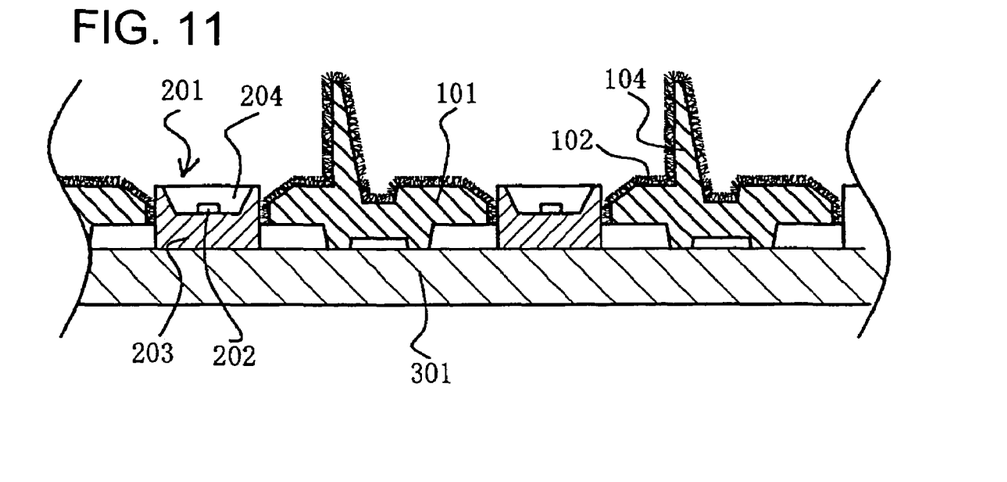
FIG. 11 is a schematic, enlarged, cross-sectional view taken along line XI—XI in FIG. 3 showing a fiber implanted portion of the third embodiment according to the present invention.

On the observation-side surface of the mask member 101 disposed on the circuit board 301, as shown in a schematic, enlarged, cross-sectional view in FIG. 11, louvers 104 were formed having a height of 3 mm and extending in the lateral direction over the entire surface. Since the louvers 104 defined the light-emitting diodes 201 as being formed of individual dots, and also interfered with incident outside light, the image contrast could be improved. As a result, the emission light was brilliant. In addition, since the fine projections 102 were also formed on the entire surfaces of the louvers 104 by flock processing, reflection of light emitted from the light-emitting diodes 201 at the louvers 104 could be suppressed, and hence sharper emission light could be obtained.

In addition, on the observation-side surface of the mask member 101, the groove portions 103 were provided to extend in the vertical direction so as to approximately perpendicularly intersect the louvers 104 extending in the lateral direction. Since the groove portions 103 were formed between the light-emitting diodes 201, the louvers 104 were prevented from being viewed to a certain extent. As a result, an LED display apparatus could be realized having a high contrast ratio which is formed of more uniform dark brightness over the entire observation-side surface.

According to the present invention, by a relatively simple structure, dust and the like can be prevented from entering spaces formed between the openings of the mask member provided on the circuit board and the light-emitting diodes placed inside the openings described above. Thus with this structure, the circuit board can be preferably protected, the light-emitting diode can be driven with high reliability for a long period of time, and cleaning can also be easily performed. In addition, stress generated by the thermal expansion of the light-emitting diode in light emission can also be reduced. In addition, when the fine projections are formed over the entire observation-side surface of the mask member, reflection of outside light can be suppressed, and when the fine projections have a dark color, the image contrast can also be improved.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application no. 2003-156063 filed May 30, 2003 is hereby incorporated by reference.

What is claimed is:

1. An LED display apparatus comprising:
   a circuit board;
   a plurality of light-emitting diodes arranged at predetermined positions on the circuit board; and
   a mask member having a plurality of openings therein, each of the openings being defined by a side surface in the mask member, wherein the mask member further includes fine projections disposed on at least a portion of the side surface defining at least one of the openings.

2. The LED display apparatus according to claim 1, wherein each of the openings is defined by a plurality of side surfaces and the fine projections are disposed on portions of the side surfaces defining at least one of the openings.

3. The LED display apparatus according to claim 1, wherein the fine projections are disposed on at least an upper portion of the side surface defining at least one of the openings.

4. The LED display apparatus according to claim 1, wherein the fine projections are disposed over an entire side surface defining the openings.

5. The LED display apparatus according to claim 1, wherein the mask member includes additional fine projections over an entire observation-side surface thereof.

6. The LED display apparatus according to claim 5, wherein the mask member is disposed so that an observation-side surface thereof is located at a position equal to or higher than a top surface of each of the light-emitting diodes.

7. The LED display apparatus according to claim 1, wherein a portion of the side surface of the openings of the mask member are inclined.

8. The LED display apparatus according to claim 1, wherein the mask member comprises at least one louver.

9. The LED display apparatus according to claim 8, wherein the louver has fine projections thereon.

10. The LED display apparatus according to claim 1, wherein the mask member comprises a lattice-shaped groove portion between the openings.

11. The LED display apparatus according to claim 1, wherein the mask member includes the fine projections on the entire side surface and the fine projections are spaced from the circuit board.

12. An LED display apparatus comprising:
a circuit board;
a plurality of light-emitting diodes arranged at predetermined positions on the circuit board; and
a mask member having a plurality of openings therein, each of the openings being defined by a side surface in the mask member, wherein the mask member further includes fine projections disposed on an entire side surface defining at least one of the openings.

13. The LED display apparatus according to claim 12, wherein each of the openings is defined by a plurality of side surfaces and the fine projections are disposed on the entire side surfaces defining at least one of the openings.

14. The LED display apparatus according to claim 12, wherein the mask member includes additional fine projections over an entire observation-side surface thereof.

15. The LED display apparatus according to claim 14, wherein the mask member is disposed so that an observation-side surface thereof is located at a position equal to or higher than a top surface of each of the light-emitting diodes.

16. The LED display apparatus according to claim 12, wherein a portion of the side surface of the openings of the mask member are inclined.

17. The LED display apparatus according to claim 12, wherein the mask member comprises at least one louver.

18. The LED display apparatus according to claim 17, wherein the louver has fine projections thereon.

19. The LED display apparatus according to claim 12, wherein the mask member comprises a lattice-shaped groove portion between the openings.

20. The LED display apparatus according to claim 12, wherein the fine projections are spaced from the circuit board.

21. An LED display apparatus comprising:
a circuit board;
a plurality of light-emitting diodes arranged at predetermined positions on the circuit board; and
a mask member having a plurality of openings therein, each of the openings being defined by a side surface in the mask member, and
wherein corner portions of the mask member are disposed between a light observation-side surface of the mask member and a side surface of the openings, the mask member further includes fine projections disposed on at least a portion of the side surface defining at least one of the openings and the corner portions.

22. The LED display apparatus according to claim 21, wherein the corner portions having an inclined surface relative to the side surface of the openings.

23. The LED display apparatus according to claim 22, wherein each of the openings is defined by a plurality of side surfaces and the fine projections are disposed on portions of the side surfaces defining at least one of the openings.

24. The LED display apparatus according to claim 22, further comprising additional fine projections disposed on the inclined surface.

25. The LED display apparatus according to claim 22, wherein the fine projections are disposed over an entire side surface defining the opening.

26. The LED display apparatus according to claim 22, wherein the mask member includes additional fine projections over the entire observation-side surface thereof.

27. The LED display apparatus according to claim 26, wherein the mask member is disposed so that the observation-side surface is located at a position equal to or higher than a top surface of each of the light-emitting diodes.

28. The LED display apparatus according to claim 22, wherein the mask member comprises at least one louver.

29. The LED display apparatus according to claim 28, wherein the louver has fine projections thereon.

30. The LED display apparatus according to claim 22, wherein the mask member comprises a lattice-shaped groove portion between the openings.

31. The LED display apparatus according to claim 22, wherein the mask member includes the fine projections on the entire side surface and the fine projections are spaced from the circuit board.

* * * * *